US007888178B2

(12) United States Patent
Wada et al.

(10) Patent No.: US 7,888,178 B2
(45) Date of Patent: Feb. 15, 2011

(54) METHOD TO PRODUCE REFLECTOR WITH AN OUTER PERIPHERAL EDGE PORTION OF AN UPPER SURFACE UNCOVERED BY A REFLECTION FILM AND TO PRODUCE A LIGHTEMITTING DEVICE USING THE SAME REFLECTOR

(75) Inventors: Takahiro Wada, Hachioji (JP); Satoru Kikuchi, Hachioji (JP)

(73) Assignee: Citizen Electronics Co., Ltd., Yamanashi (JP)

( * ) Notice: Subject to any disclaimer, the term of this patent is extended or adjusted under 35 U.S.C. 154(b) by 375 days.

(21) Appl. No.: 12/014,568

(22) Filed: Jan. 15, 2008

(65) Prior Publication Data
US 2008/0185605 A1    Aug. 7, 2008

(30) Foreign Application Priority Data
Jan. 15, 2007    (JP)    ............................ 2007-005584

(51) Int. Cl.
*H01L 21/48*    (2006.01)
(52) U.S. Cl. .......................... 438/113; 438/29; 438/33; 362/332; 362/346
(58) Field of Classification Search .................. 438/25, 438/26, 28, 29, 33; 362/332, 346
See application file for complete search history.

(56) References Cited

U.S. PATENT DOCUMENTS

2002/0163006 A1*  11/2002  Yoganandan et al. .......... 257/81

2005/0133939 A1*  6/2005  Chikugawa et al. .......... 257/790
2006/0244623 A1*  11/2006  Pederson ............... 340/815.45

FOREIGN PATENT DOCUMENTS

JP    2004327955 A1    11/2004

* cited by examiner

*Primary Examiner*—Anh D Mai
(74) *Attorney, Agent, or Firm*—Browdy & Neimark, PLLC (57) ABSTRACT

An LED includes a circuit board (1), a light emitter (3) mounted on the circuit board (1), and a reflector (4) mounted on the circuit board (1), the light emitter (3) including an LED element mounted on the circuit board (1) and a light-transmitting resin (2) to seal the LED element. The reflector (4) is configured to surround the light emitter (3) and includes an opening (5) which passes through an upper surface and a lower surface is provided at a central position to allow insertion of the light emitter (3), and an inclined inner surface in the opening (6) configured to be upwardly broadened. A reflection film (7) is provided on the inclined inner surface (6) of the opening in the reflector. A outer peripheral edge is a non-reflection film constituted area (8) and, simultaneously, a terminal position identification mark (10) adjacent to the non-reflection film constituted area (8) are provided. The reflector (4) is cut along a dicing line on the non-reflection film constituted area (8) where the reflection film is not provided, thus preventing the reflection film (7) from being peeled off.

4 Claims, 11 Drawing Sheets

METHOD TO PRODUCE REFLECTOR WITH AN OUTER PERIPHERAL EDGE PORTION OF AN UPPER SURFACE UNCOVERED BY A REFLECTION FILM AND TO PRODUCE A LIGHTEMITTING DEVICE USING THE SAME REFLECTOR

CROSS-REFERENCE TO THE RELATED APPLICATION

This application is based on and claims priority from Japanese Patent Application No. 2007-005584, filed on Jan. 15, 2007, the disclosure of which is incorporated herein by reference in its entirety.

BACKGROUND OF THE INVENTION

1. Field of the Invention

The present invention relates to a light-emitting diode (LED) such as an LED for generic illumination, an LED for a flash light of a mobile phone with a camera, an LED to illuminate operational keys of electronic devices and a method to produce such LEDs, more specifically, to an LED including a reflector to efficiently reflect light emitted from an LED element and a method to produce the LEDs, whereby each of the reflectors can be efficiently produced.

2. Description of Related Art

In general, it has been increasing demand for smaller and more thinned surface mount-type light-emitting diodes (SM-type LEDs) used in electronic devices. Most LEDs used as supplementary light sources for cameras of mobile phones, or LEDs for spot lights or the like are structured to have respectively required directivities of emission light. LEDs provided with a reflector or lens to reflect or collect light emitted from the LED element are configured to have light directivity meeting various requirements respectively.

A typical LED has been proposed, in which LED elements are electrically mounted on an upper surface of a circuit board made of glass epoxy with wiring patterns and a reflector or lens which is separately formed is adhered to the upper surface of the circuit board by a UV-hardening-type adhesive or the like. The reflector is disposed to surround the LED elements, so that light emitted from the LED elements can be effectively utilized (for reference, see JP 2004-327955A, pages 4 and 5 in the specification and FIGS. 1 to 5).

More specifically, the conventional LED disclosed in the reference includes a circuit board 21, a light emitter 24 mounted on an upper surface of the circuit board 21 and the reflector 25 including an opening provided with an inclined inner surface 27 to surround the light emitter 24, as shown in FIGS. 17 to 20. The light emitter 24 includes three LED elements 22 and a light-transmitting resin 23 to seal the LED elements 22.

Figure 18:
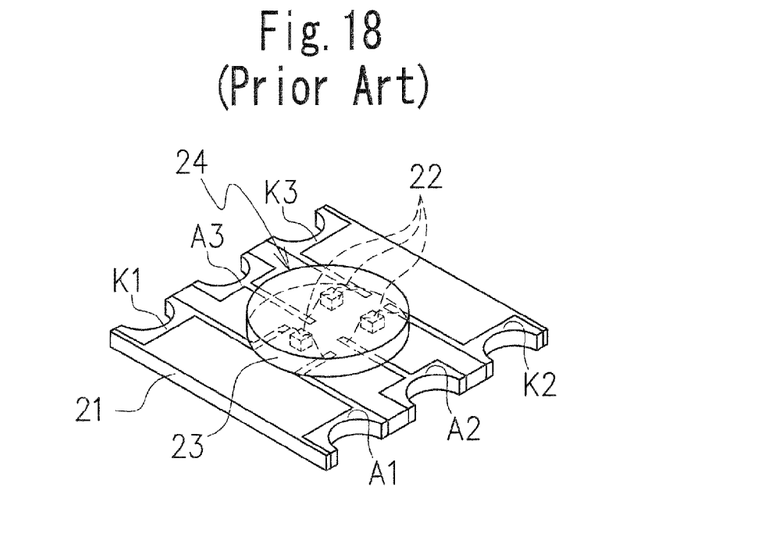
FIG. 18 is a perspective view showing a state where a light emitter is mounted on a circuit board of the conventional LED.

The circuit board 21 is formed in a generally square shape by glass epoxy resin, bismaleimide triazine (BT) resin or the like and has at opposing side surfaces anode electrodes (A1, A2, A3) and cathode electrodes (K1, K2, K3) which are formed by through holes, as shown in FIG. 18. The three LED elements 22 are mounted on a central portion of an upper surface of the circuit board 21 and are electrically connected through bonding wires to the anode electrodes (A1, A2, A3) and the cathode electrodes (K1, K2, K3), respectively.

Figure 17:
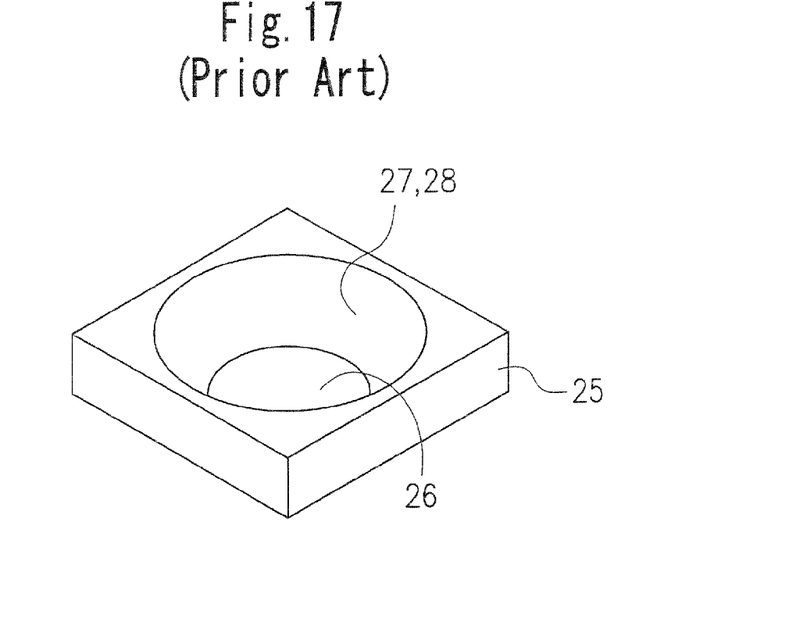
FIG. 17 is a perspective view showing a reflector of a conventional LED.

The reflector 25 has a shape corresponding to a shape of the circuit board 21 on which the reflector 25 is mounted, as shown in FIG. 17. The reflector 25 has an opening 26 passing through the upper surface and the lower surface of the reflector at a central portion thereof, and the opening includes an inclined surface 27 inside the opening and, the inclined surface is upwardly broadened. A reflection film 28 is provided on the inclined surface 27 by nickel plating, silver-type plating or the like.

Figure 19:
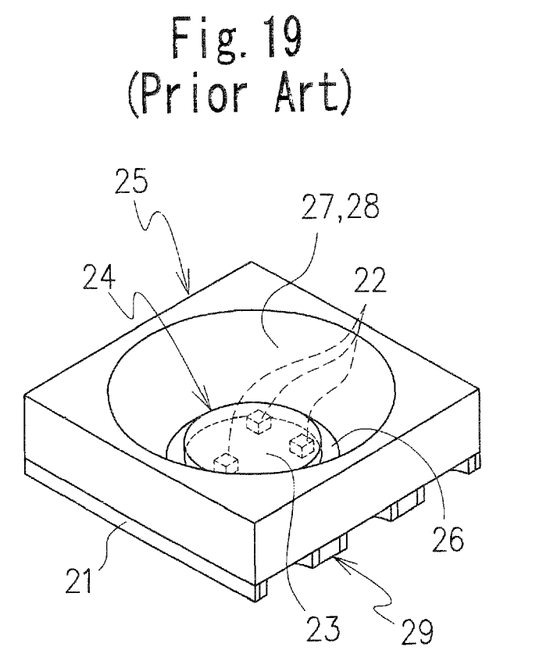
FIG. 19 is a perspective view of the conventional LED.
Figure 20:
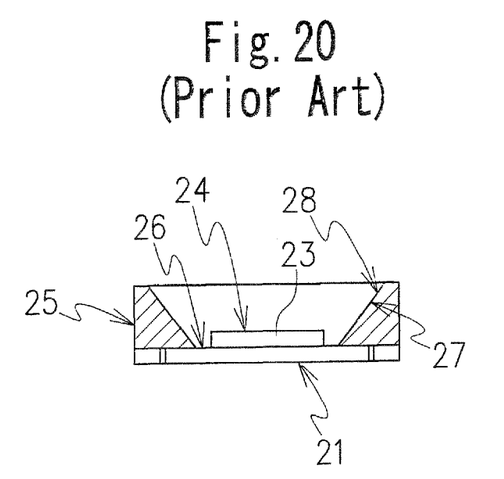
FIG. 20 is a sectional view of FIG. 19.

The conventional LED includes the reflector 25 adhered to the circuit board 21 on which the LED elements 22 are mounted, using a UV-hardening-type adhesive or the like, as shown in FIGS. 19 and 20.

In such a conventional LED, and in a case that the LED is bilaterally-symmetrical or the like, an identification number or cathode mark is provided on a surface of the LED so that a position of a terminal 29 can be visually confirmed when the LED article is viewed from above.

Figure 21:
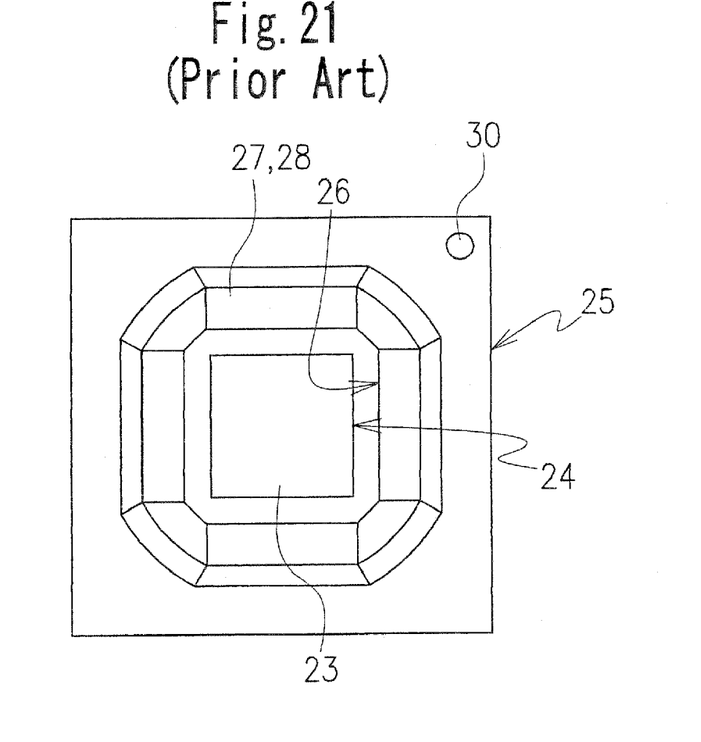
FIG. 21 is a plan view showing a state where a terminal position identification mark is provided on an upper surface of a reflector of a conventional LED.
Figure 22:
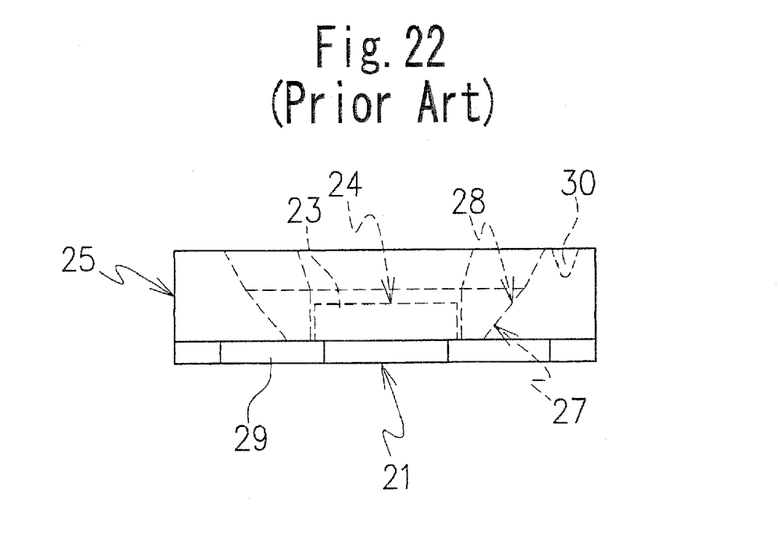
FIG. 22 is a sectional view of FIG. 21.

As shown in FIGS. 21 and 22, a concave-shaped terminal position identification mark 30 is provided on a surface of the reflector 25 by means of a mold when the reflector is formed.

However, in the conventional LED disclosed in the aforementioned reference, in the case that a plurality of reflectors are produced from a blank by multi-cavity molding, a reflector assembly is first formed, and a reflection film is then plated or deposited on the inclined surface. Thereafter, a dicing machine is used to cut and separate the reflector assembly into individual reflectors. This gives a risk that the reflection film may be peeled off from a portion where the reflection film is plated or deposited when the reflector assembly is diced. A top coat on the reflection film after formation may be considered as a countermeasure to such peeling off of the reflection film, however, the provision of the top coat causes a reduction in the reflectance of the reflection film.

In addition, in the case that the terminal position identification mark is provided on the reflector, a problem arises that a relatively complex mold jig is required to form a concave-shaped portion on an upper surface of the reflector and hence an excessive amount of labor is required to produce the mold jig.

SUMMARY OF THE INVENTION

A first object of the present invention is to provide an LED including a reflector having a structure capable of effectively reflecting light emitted from an LED element, resulting in allowing easy production.

A second object of the present invention is to provide a method for producing LEDs, whereby reflectors can be efficiently formed.

To accomplish the above first object, an LED according to one embodiment of the present invention includes a circuit board, a light emitter mounted on the circuit board, and a reflector attached to the circuit board to surround the light emitter and configured to reflect light emitted from the light emitter.

The reflector has an opening passing through an upper surface and a lower surface at a center thereof, and the opening includes an inclined inner surface that is upwardly broadened. In other words, the inclined inner surface has a truncated-cone shape or a multangular truncated-pyramid shape that is upwardly broadened in the reflector.

A reflection film is provided on the inclined surface of the reflector, and a non-reflection film constituted area on which the reflection film is not provided is formed on an outer peripheral edge portion at an upper surface of the reflector.

To accomplish the above second object, a method to produce LEDs according to one embodiment of the present invention includes a process for mounting a light emitter on a circuit board, especially a process for forming a plurality of reflectors each including an opening to surround each of the light emitter, a process for setting a mold jig to cover each outer peripheral edge portion at the upper surface of the reflectors, a process for providing a reflection film on the inclined inner surface in the opening and an upper surface of the reflector on which the mold jig is set, and therefore, forming a non-reflection film constituted area is provided on the upper surface of the reflector at an outer peripheral edge portion, a process for dicing at the outer peripheral edge portion of the reflector, which is the non-reflection film constituted area at the upper surface of the reflector, and a process for mounting the diced reflector on the circuit board so that the inclined surface inside the opening surround the light emitter.

DETAILED DESCRIPTION OF THE PREFERRED EMBODIMENTS

Preferred embodiments of the present invention will be explained in detail below with reference to the accompanying drawings.

First Embodiment

Figure 1:
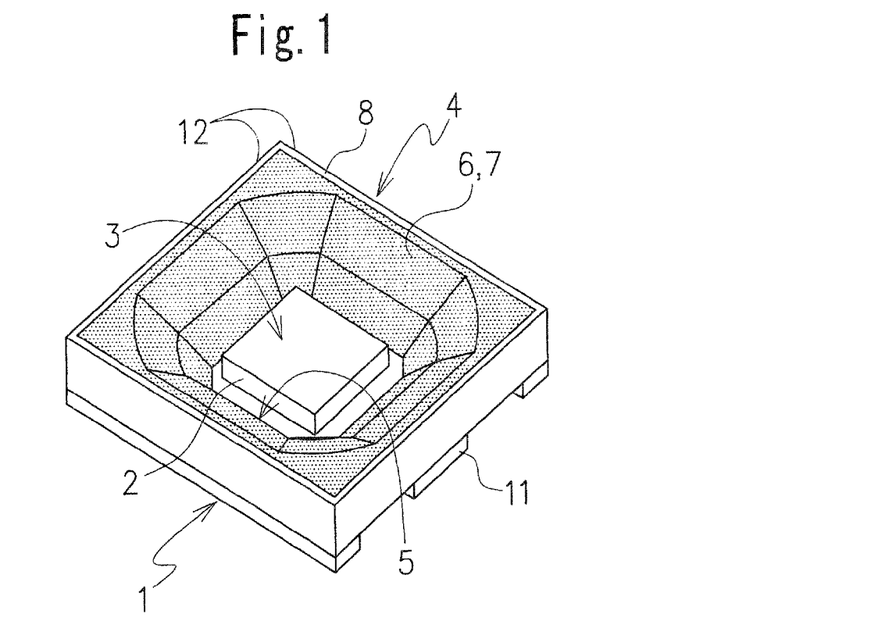
FIG. 1 is a perspective view of an LED according to a first embodiment of the present invention.

FIG. 1 illustrates a first embodiment of a light-emitting diode (hereinafter, referred to as LED) according to the present invention and FIGS. 3 to 14 illustrate a method for producing LEDs.

Figure 2:
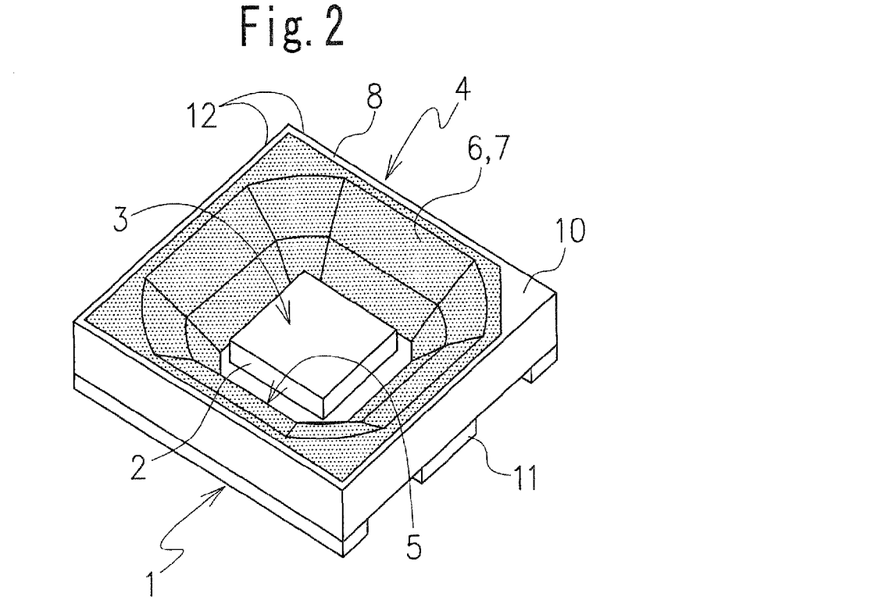
FIG. 2 is a perspective view of an LED according to a second embodiment of the present invention.

The LED includes a circuit board 1, as shown in FIGS. 1 and 2. The circuit board 1 is made of, for example, glass epoxy or BT resin and has, for example, a generally square shape as viewed in plane. Of course, the circuit board 1 is not limited to a square shape, and may be formed in a rectangular shape.

Mounted on the circuit board 1 is a light emitter 3 which includes at least one LED element (not shown) and a light-transmitting resin 2 configured to seal the LED element. It is preferable to provide a plurality of LED elements to obtain high emission intensity of the light emitter. It should be noted that the circuit board 1 is provided with suitable electrode parts (not shown) to which the LED element is electrically connected.

In FIGS. 1 and 2, reference number 11 shows one of the terminals extending from the electrode parts.

Figure 14:
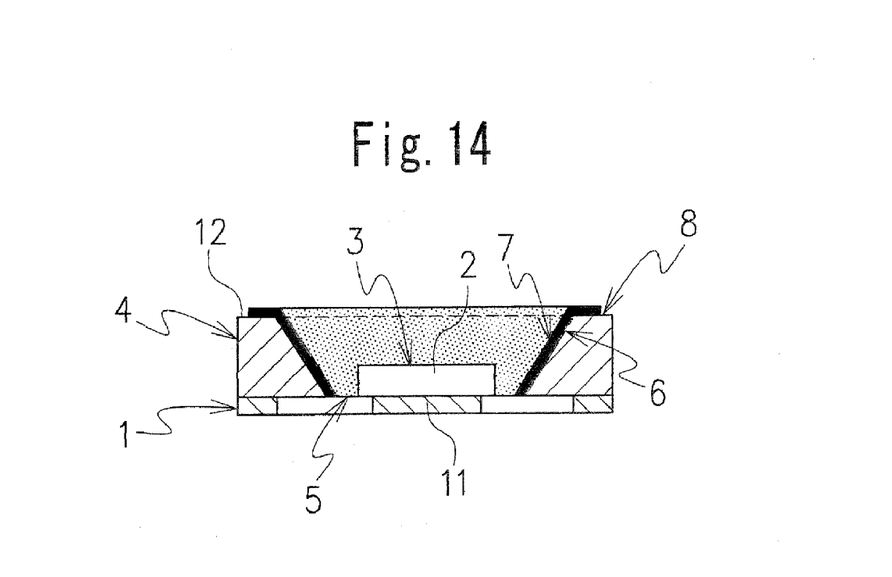
FIG. 14 is a sectional view of FIG. 13.

A reflector 4 is mounted on the circuit board 1 to surround the light emitter 3 mounted on the circuit board 1 (see FIGS. 1, 2 and 14). The reflector 4 is formed by any resin and, in the illustrated embodiment, has a substantially square outline shape similar to that of the circuit board. The reflector 4 includes an opening 5 passing through an upper surface and a lower surface of the reflector at a center thereof, and the opening 5 includes an inclined inner surface 6 that is upwardly broadened. In other words, the inclined inner surface has a truncated-cone shape or a multangular truncated-pyramid shape that is upwardly broadened in the reflector (see FIGS. 1, 2 and 14).

The upper surface of the reflector 4 includes a flat upper surface extending from a periphery of the opening to the outer peripheral edge portion. The reflector 4 is disposed on an upper surface of the circuit board so that the light emitter 3 is disposed in the opening to be surrounded by the inclined surface 6 of the reflector.

A metallic film 7 made of Al, Ag or the like having high reflectance is provided on the inclined surface 6. More specifically, the reflection film 7 is provided on the entire inclined surface 6 and a part of the upper surface 12, which is an adjacent part to the opening but is not provided on an outer peripheral edge portion 12 at the upper surface of each reflector (see FIGS. 1 and 2). Here, the outer peripheral edge portion of each reflector 4 is a peripheral connecting portion of outer edge portions of four sides on the upper surface thereof.

The reflection film 7 acts to upwardly reflect light emitted from the light emitter 3. A method for providing the reflection film 7 is described below. The reflection film 7 is provided on the entire inclined surface 6 and the part of the upper surface 12 by means of plating or deposition. The reflection film 7 is formed, for example, as a high reflectance dielectric body multi-layered film comprising multi-layered film with high reflectance.

In the case of an LED package other than white, the reflection film 7 may have its reflection wavelength limited or it may undergo a high reflectivity treatment.

A non-reflection film constituted area 8 on which the reflection film 7 is not provided is formed on the outer peripheral edge portion of the reflector 4 at the upper surface thereof, in other words, the outer circumferential edge portion of the upper surface 12 of the reflector having a generally square outline shape. The non-reflection film constituted area 8 is formed by a production method which is described below (see FIGS. 1 and 2).

It should be noted that the reflector 4 can be adhered or joined to the circuit board 1 using, for example, a UV-hardening-type adhesive or by another method.

Next, a method for producing the aforementioned LED is explained with reference to FIGS. 3 to 14.

Figure 3:
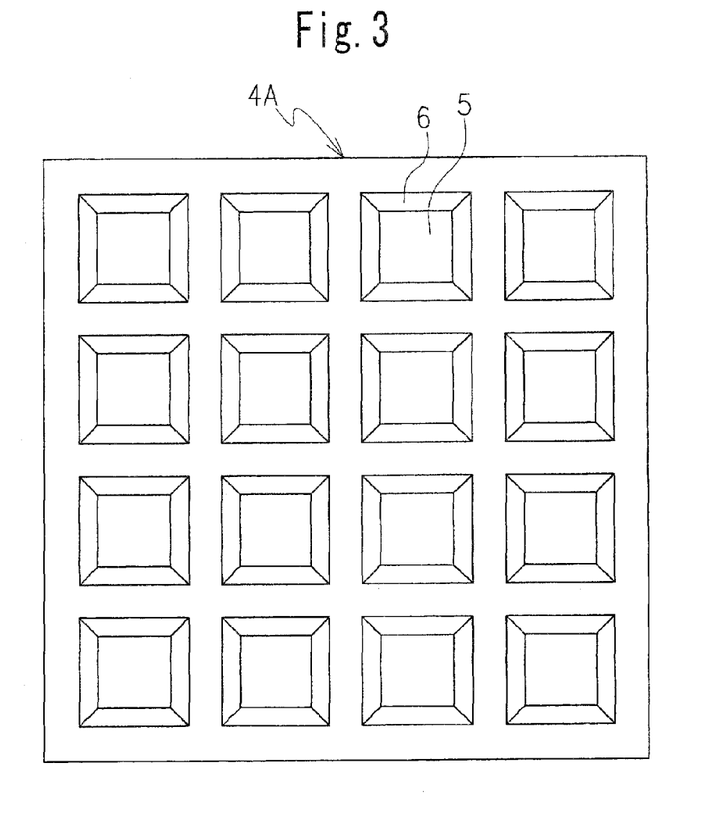
FIG. 3 is a plan view showing a process to form a reflector assembly including a plurality of reflectors shown in FIG. 1.
Figure 4:
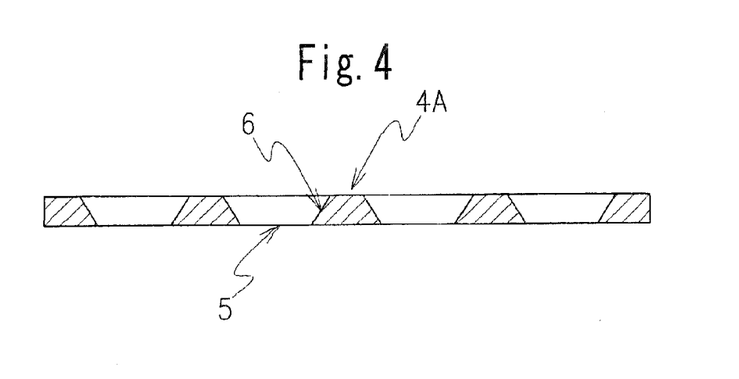
FIG. 4 is a sectional view of FIG. 3.

In the embodiment as shown in FIGS. 3 and 4, the case is described in which the reflectors 4 are made by multi-cavity molding. However, it should be noted that a production method according to the present invention can also be applied to the case in which a reflector 4 is individually made by a single-cavity molding.

FIGS. 3 and 4 illustrate a process for forming a reflector assembly 4A. The forming process is configured to form the reflector assembly 4A in which a plurality of reflectors are arranged integrally in a grid pattern, each of the reflectors having a generally square shape in plane, and having at a central bottom position thereof an opening 5 passing through an upper surface and a lower surface. The opening 5 includes an inclined surface 6 that is upwardly broadened. In other words, the incline surface 6 has a truncated-cone shape or a multangular truncated-pyramid shape that is upwardly broadened in the reflector.

Figure 5:
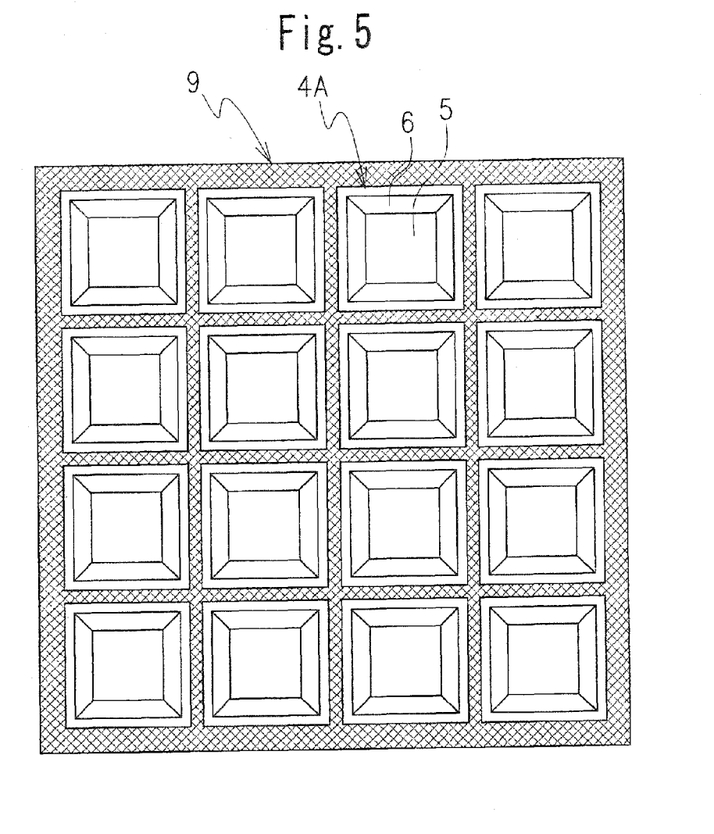
FIG. 5 is a plan view showing a state where a mold jig is set on an upper surface of the reflector assembly shown in FIG. 3.
Figure 6:
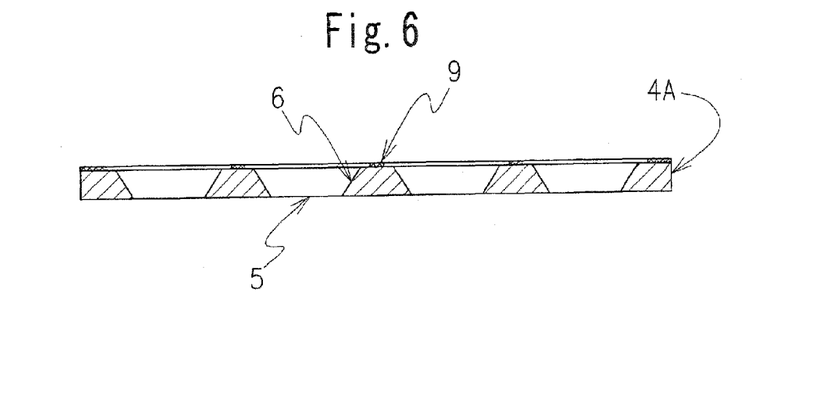
FIG. 6 is a sectional view of FIG. 5.

FIGS. 5 and 6 illustrate a process to set a mold jig or cover 9 on an upper surface of the reflector assembly 4A. The mold jig 9 is structured and set to cover an outer circumferential edge portion of each of the individual reflector parts of the reflector assembly 4A.

Instead of the mold jig 9, the outer circumferential edge portion may be masked by a resist.

The mold jig 9 is structured to cover the reflector parts such that a reflection film 7 is provided on each of the entire inclined surface 6 and the part of the upper surface 12 of each of the reflectors, but is not provided on the outer peripheral edge portion of the upper surface each reflector part (see FIG. 6).

Figure 7:
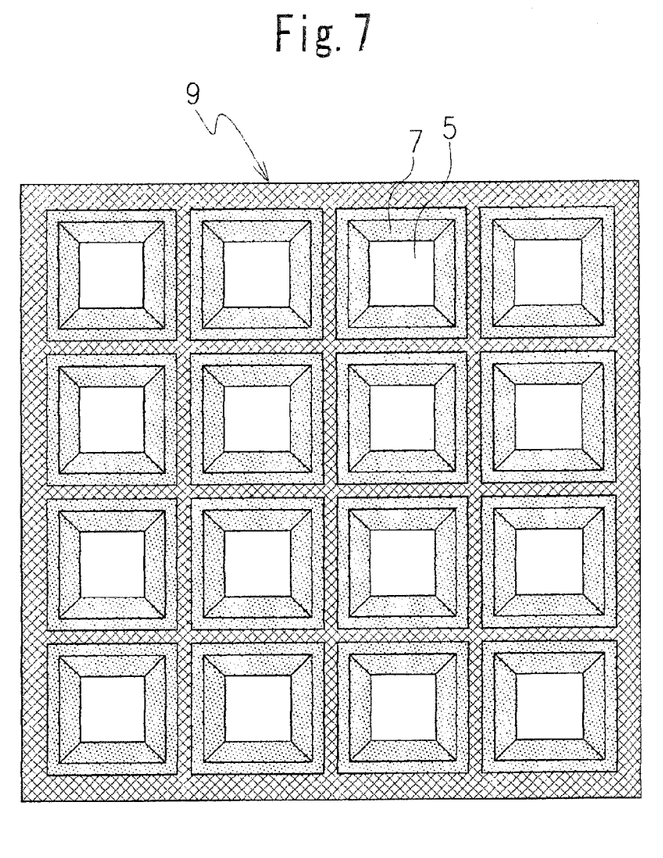
FIG. 7 is a plan view showing a state where the reflection film is provided on the reflector assembly after setting of the mold jig as shown in FIG. 5.
Figure 8:
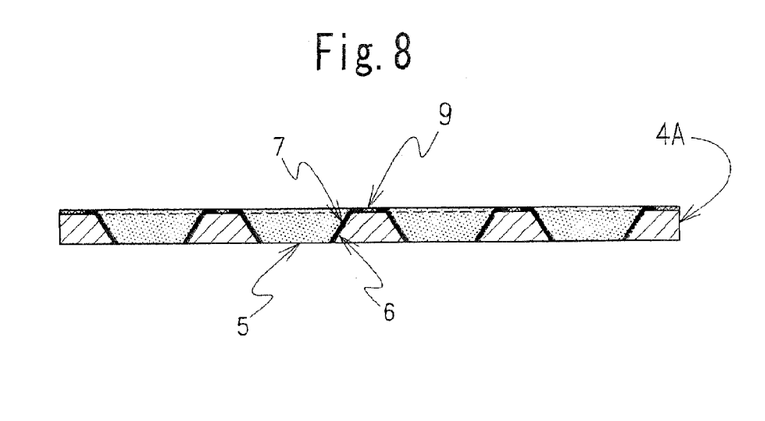
FIG. 8 is a sectional view of FIG. 7.

FIGS. 7 and 8 illustrate a process to form a reflection film. In the process, the reflection film 7 is formed on the inclined surface 6 by providing a high reflectance metallic film made of Al, Ag or the like on the inclined surface 6 by means of plating, deposition or the like in a state where the mold jig 9 is set on the reflector assembly 4A.

Figure 9:
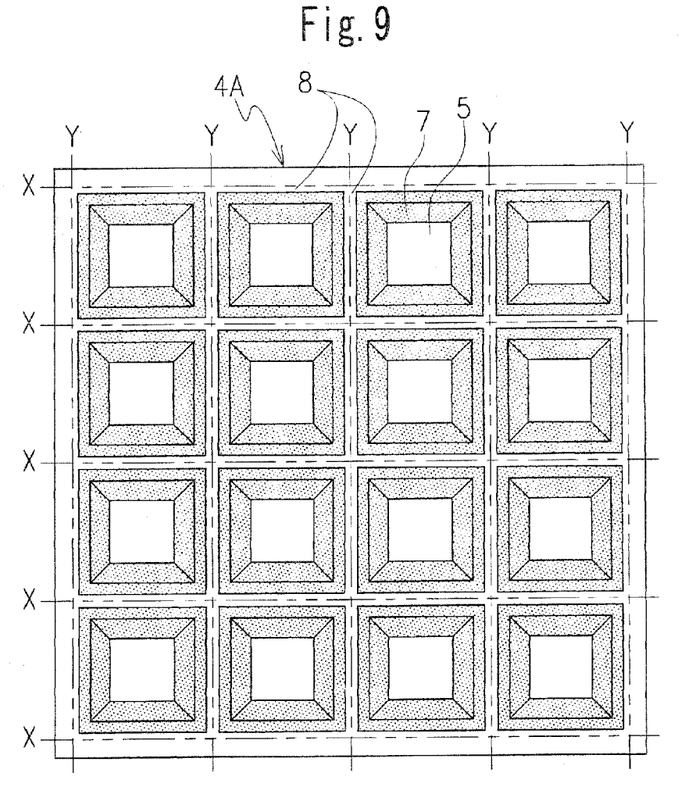
FIG. 9 is a plan view showing the reflection film provided area and non-reflection film constituted areas on which the reflection film is not provided, in a state where the mold jig as shown in FIG. 7 has been removed.
Figure 10:
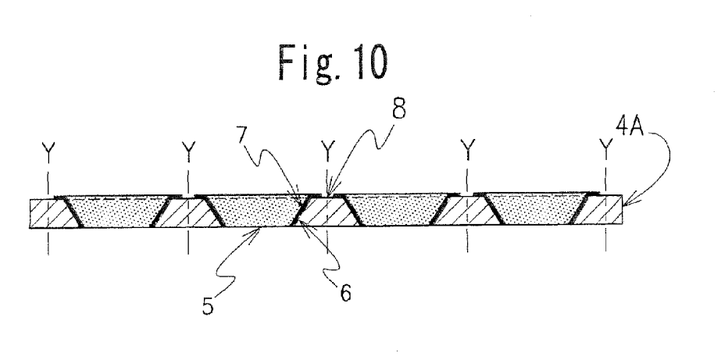
FIG. 10 is a sectional view of FIG. 9.

FIGS. 9 and 10 illustrate a process to remove the mold jig 9 from the reflector assembly. When the mold jig 9 is removed from the reflector assembly 4A, a non-reflection film constituted area 8 on which the reflection film 7 is not provided is formed on the outer peripheral edge portion of each of the square reflector parts, and the adjacent reflectors are separated by the non-reflection film constituted area 8.

Figure 11:
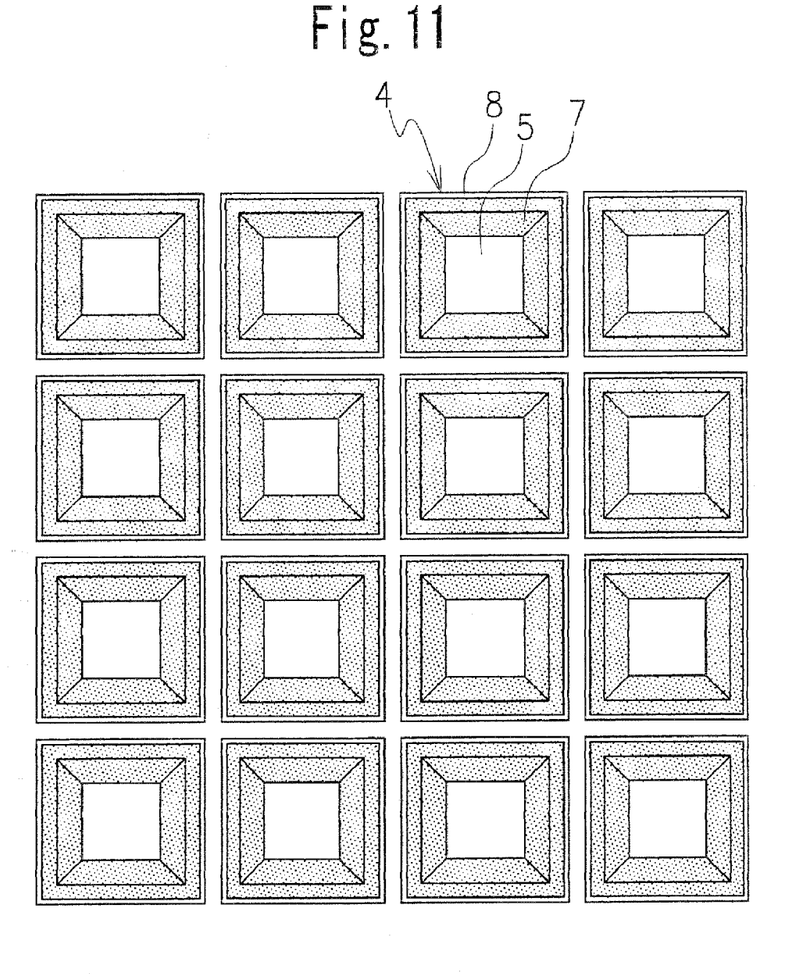
FIG. 11 is a plan view showing a state where the reflector assembly is divided into individual reflectors by dicing the reflector assembly as shown in FIG. 9.
Figure 12:
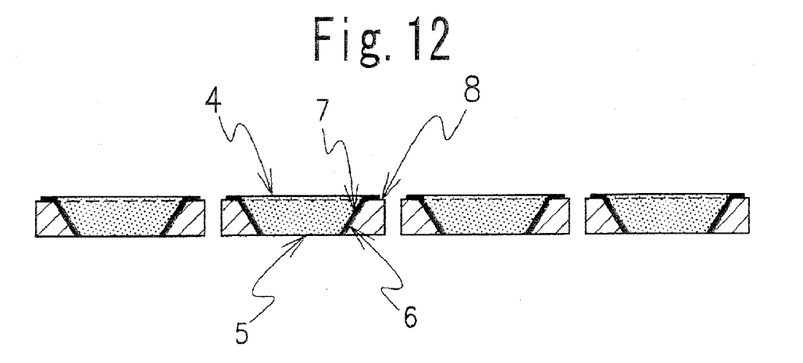
FIG. 12 is a sectional view of FIG. 11.

FIGS. 11 and 12 illustrate a process for dicing the reflector assembly 4A to form individual reflectors. In the process, the individual reflectors are formed by cutting the reflector assembly 4A as shown in FIG. 9 along dicing lines X and Y which are perpendicular to each other and provided on each of the non-reflection film constituted areas 8 on which the reflection film 7 is not provided.

At this stage, each of a plurality of reflectors 4 thus obtained has a structure such that the reflection film 7 is formed on the inclined surface 6 and the part of the upper end surface 12, but also such that the non-reflection film constituted area 8 on which the reflection film 7 is not provided is formed on the outer circumferential edge portion of the reflector 4, as shown in FIG. 12.

Separately from the aforementioned processes to form the reflectors, a light emitter 3 which includes one or more LED elements and a light-transmitting resin sealing these LED elements is installed on a single circuit board 1 which has a substantially square outline shape in plane similar to that of the reflector 4.

Figure 13:
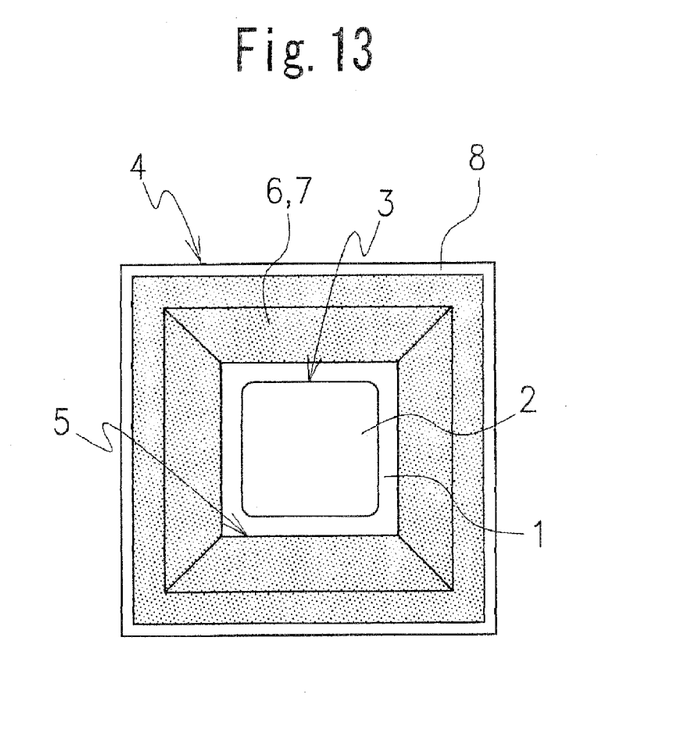
FIG. 13 is a plan view of the LED as shown in FIG. 1.

FIGS. 13 and 14 illustrate a joining process to mount each reflector 4 on the circuit board 1 on which the light emitter 3 is mounted.

In the joining process, the divided reflector 4 is mounted on the circuit board 1 on which the light emitter 3 including the LED elements and the light-transmitting resin 2 configured to cover the LED elements is mounted. In this case, the reflector 4 is disposed on the circuit board 1 so that the inclined surface 6 surrounds the light emitter 3, and adhered to the circuit board 1 using, for example, a UV-hardening-type adhesive or the like. Thereby, an LED in which the non-reflection film constituted area 8 having no reflection film 7 is formed on the outer peripheral edge portion of the generally square reflector 4 is completed.

As mentioned above, when multi-cavity molding of the reflector is carried out, because the non-reflection film constituted area 8 which is provided on the outer circumferential edge portion of the reflector 4 and has no reflection film 7 is cut (diced), the reflection film 7 is prevented from being peeled off.

Second Embodiment

Figure 15:
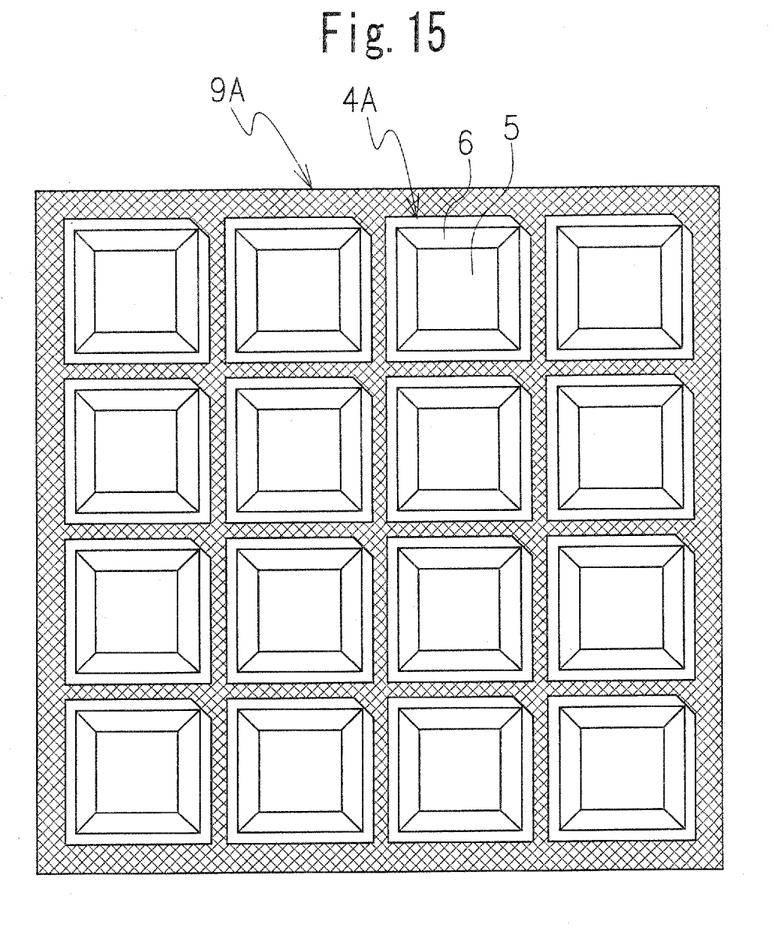
FIG. 15 is a plan view showing a state where the mold jig is set on an upper surface of the reflector assembly as shown in FIG. 2.
Figure 16:
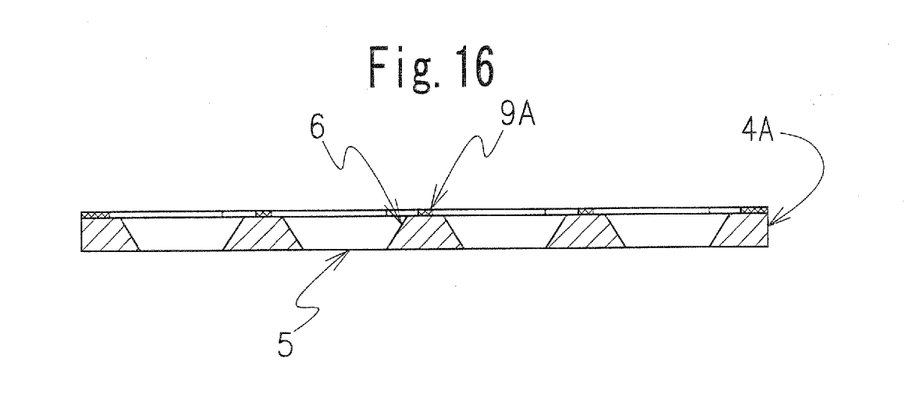
FIG. 16 is a sectional view of FIG. 15.

FIG. 2 illustrates a second embodiment of an LED according to the present invention and FIGS. 15 and 16 illustrate a method to produce LEDs.

As shown in FIG. 2, the LED in the second embodiment differs from that in the aforementioned first embodiment in that adjacent to the non-reflection film constituted area 8 on which the reflection film 7 is not provided, a terminal position identification mark 10 indicating that the reflection film 7 is not applied is further provided on an outer circumferential portion of the generally square reflector 4 as viewed in plane.

The terminal position identification mark 10 is provided on an upper surface of the LED, that is to say the LED according to the present invention, to allow visual confirmation of a position of the terminal 11 of the electrode parts of the LED, in the case that an LED, in particular, a bilaterally-symmetrical LED, is viewed from above.

Next, a method to provide the terminal position identification mark 10 is described.

As shown in FIGS. 15 and 16, a mold jig 9A disposed to cover the reflector assembly 4A has a structure configured to cover a generally square (as viewed in plane) outer circumferential edge portion of each of the reflector parts of the reflector assembly 4A and a portion of the reflector part at one of four corners adjacent to the outer circumferential edge portion where the terminal position identification mark 10 indicating that the reflection film is not applied is provided. The reflection film 7 is provided in a state where the mold jig 9A is disposed on the upper surface of the reflectors, and when the mold jig 9A is removed, thereafter, from the reflector assembly 4A, the terminal position identification mark 10 is formed on each of all the reflector parts, as shown in FIG. 2.

Descriptions of the processes other than the process to form the terminal position identification mark 10 are omitted because they are the same as in the first embodiment.

By executing the process for forming the reflector assembly 4A, the process for setting the mold jig 9A, the process for forming the reflection film 7, the process for removing the mold jig 9A, the process for dicing the reflector assembly 4A, and the process for joining the divided reflector to the circuit board on which the light emitter 3 is mounted, it is possible to obtain an LED in which the terminal position identification mark 10 is applied to one of the four corners of the reflector 4, as shown in FIG. 2.

With the structure as described above, in particular, when the individual reflectors 4 are produced from the reflector assembly by multi-cavity molding, there is an advantageous effect that a large number of reflectors can be formed simultaneously without the reflection film being peeled off, simply by dicing the non-reflection film constituted area 8 between the adjacent reflectors where the reflection film is not provided.

In particular, by providing the non-reflection film constituted area, it is possible to prevent peeling off of the reflection film by the dicing process and achieve an increment in process yield.

Also, it is not necessary to provide a top coat on the reflection film as a countermeasure to peeling off of the reflection film as in conventional art, and it is therefore possible to prevent a reduction in reflectance of the reflection film due to the top coat.

In addition, in the case that the terminal position identification mark 10 identifying the terminal position of the LED is provided, because the mark is formed adjacent to the non-reflection film constituted area where the reflection film is not provided, simultaneously with the formation of the non-reflection film constituted area, it is possible to provide an inexpensive LED which has excellent reliability and can be easily produced by simple processes without requiring excessive labor.

Although the preferred embodiments of the present invention have been described, it should be noted that the present invention is not limited to these embodiments, and various modifications and changes can be made to the embodiments.

What is claimed is:

1. A method to produce a reflector comprising:
   forming a reflector assembly having a plurality of openings, each provided with an inclined inner surface, and each passing through an upper surface and a lower surface of the reflector assembly;
   setting a mold jig on the upper surface of the reflector assembly to cover an outer peripheral edge portion of the upper surface around each opening, and
   providing a reflection film on the inclined inner surface of each opening and the upper surface except the outer peripheral edge portion of the upper surface around each opening; and
   dicing the reflector assembly along the outer peripheral edge portion of the upper surface around each opening to divide the reflector assembly into individual reflectors.

2. A method to produce a light-emitting device with reflector comprising:
   providing a light emitters each including at least one light-emitting diode element mounted on a circuit board and a light-transmitting resin to seal the light-emitting diode element, and the circuit board having a substantially square or rectangular outline shape as viewed in plane;
   forming a reflector assembly in which a plurality of reflectors are arranged integrally in a grid pattern, each of the reflectors having a substantially same outline shape as the circuit board as viewed in plane, the reflector assembly having a plurality of openings, each passing through an upper surface and a lower surface at each reflector of the reflector assembly, and each of the openings having an inclined inner surface configured to be upwardly broadened;
   setting a mold jig to cover an outer peripheral edge portion of the upper surface around each opening partial adjacent upper surface portion adjacent to the outer peripheral edge portion of the upper surface around each opening in the reflector assembly, and
   providing a reflection film on the inclined inner surface of each opening and the upper surface except the outer peripheral edge portion around each opening and the partial adjacent upper surface portion;
   dicing the reflector assembly along outer peripheral edge portion of the upper surface around each opening to divide the reflector assembly into individual reflectors; and
   joining each of the divided reflectors to each of the circuit boards each on which the at least one light-emitting diode element mounted.

3. A method to produce a reflector comprising:
   forming a reflector assembly having a plurality of openings, each provided with an inclined inner surface, and each passing through an upper surface and a lower surface of the reflector assembly;
   providing a resist to the upper surface of the reflector assembly to cover an outer peripheral edge portion of the upper surface around each opening, and providing a reflection film on the inclined inner surface of each opening and the upper surface except the outer peripheral edge portion of the upper surface around each opening; and
   dicing the reflector assembly along the outer peripheral edge portion of the upper surface around each opening to divide the reflector assembly into individual reflectors.

4. A method to produce a light-emitting device with a reflector comprising:
   providing light emitters each including at least one light-emitting diode element mounted on a circuit board and a light-transmitting resin to seal the light-emitting diode element, and the circuit board having a substantially square or rectangular outline shape as viewed in plane;
   forming a reflector assembly in which a plurality of reflectors are arranged integrally in a grid pattern, each of the reflectors having a substantially same outline shape as the circuit board as viewed in plane, the reflector assembly having a plurality of openings, each passing through an upper surface and a lower surface at each reflector of the reflector assembly, and each of the openings having an inclined inner surface configured to be upwardly broadened;
   providing a resist to cover an outer peripheral edge portion of the upper surface around each opening and a partial adjacent upper surface portion adjacent to the outer peripheral edge portion of the upper surface around each opening in the reflector assembly, and providing a reflection film on the inclined inner surface of each opening and the upper surface except the outer peripheral edge portion around each opening and the partial adjacent upper surface portion;
   dicing the reflector assembly along the outer peripheral edge portion of the upper surface around each opening to divide the reflector assembly into individual reflectors; and
   joining each of the divided reflectors to each of the circuit boards on which the at least one light-emitting diode element is mounted.

* * * * *

UNITED STATES PATENT AND TRADEMARK OFFICE
CERTIFICATE OF CORRECTION

| | | |
|---|---|---|
| PATENT NO. | : 7,888,178 B2 | Page 1 of 1 |
| APPLICATION NO. | : 12/014568 | |
| DATED | : February 15, 2011 | |
| INVENTOR(S) | : Takahiro Wada et al. | |

It is certified that error appears in the above-identified patent and that said Letters Patent is hereby corrected as shown below:

Title page item 54 add a (-) to separate the word "LIGHTEMITTING" as follows:
--METHOD TO PRODUCE REFLECTOR WITH AN OUTER PERIPHERAL EDGE PORTION OF AN UPPER SURFACE UNCOVERED BY A REFLECTION FILM AND TO PRODUCE A LIGHT-EMITTING DEVICE USING THE SAME REFLECTOR--.

Claim 2, at column 7, line 37, delete "a".
Claim 2, at column 7, line 52, add --and a-- before the word "partial."
Claim 2, at column 8, line 3, add --the-- before the word "outer."

Signed and Sealed this
Fourth Day of October, 2011

David J. Kappos
*Director of the United States Patent and Trademark Office*

UNITED STATES PATENT AND TRADEMARK OFFICE
CERTIFICATE OF CORRECTION

| | | |
|---|---|---|
| PATENT NO. | : 7,888,178 B2 | Page 1 of 1 |
| APPLICATION NO. | : 12/014568 | |
| DATED | : February 15, 2011 | |
| INVENTOR(S) | : Takahiro Wada et al. | |

It is certified that error appears in the above-identified patent and that said Letters Patent is hereby corrected as shown below:

Title page item 54 and at Column 1, lines 1-6 add a (-) to separate the word "LIGHTEMITTING" in the title, the title should read:
--METHOD TO PRODUCE REFLECTOR WITH AN OUTER PERIPHERAL EDGE PORTION OF AN UPPER SURFACE UNCOVERED BY A REFLECTION FILM AND TO PRODUCE A LIGHT-EMITTING DEVICE USING THE SAME REFLECTOR--.

Claim 2, at column 7, line 37, delete "a".
Claim 2, at column 7, line 52, add --and a-- before the word "partial."
Claim 2, at column 8, line 3, add --the-- before the word "outer."

This certificate supersedes the Certificate of Correction issued October 4, 2011.

Signed and Sealed this
Twenty-fifth Day of October, 2011

David J. Kappos
*Director of the United States Patent and Trademark Office*